(12) United States Patent
Yoshikawa et al.

(10) Patent No.: US 9,509,124 B2
(45) Date of Patent: Nov. 29, 2016

(54) PHOTOELECTRIC CONVERSION DEVICE AND CHARACTERISTIC INSPECTION METHOD FOR SAME

(75) Inventors: Akihiko Yoshikawa, Chiba (JP); Yoshihiro Ishitani, Chiba (JP); Kazuhide Kusakabe, Chiba (JP)

(73) Assignee: NATIONAL UNIVERSITY CORPORATION CHIBA UNIVERSITY, Chiba-shi, Chiba (JP)

( * ) Notice: Subject to any disclaimer, the term of this patent is extended or adjusted under 35 U.S.C. 154(b) by 596 days.

(21) Appl. No.: 13/394,049

(22) PCT Filed: Mar. 14, 2011

(86) PCT No.: PCT/JP2011/055882
§ 371 (c)(1),
(2), (4) Date: Sep. 24, 2012

(87) PCT Pub. No.: WO2011/111853
PCT Pub. Date: Sep. 15, 2011

(65) Prior Publication Data
US 2013/0016345 A1 Jan. 17, 2013
US 2013/0208267 A9 Aug. 15, 2013

(30) Foreign Application Priority Data

Mar. 12, 2010 (JP) ................. 2010-055388

(51) Int. Cl.
| | | |
|---|---|---|
| *H01L 29/49* | (2006.01) | |
| *H01S 5/343* | (2006.01) | |
| *B82Y 20/00* | (2011.01) | |
| *H01L 33/18* | (2010.01) | |
| *H01L 33/32* | (2010.01) | |
| *H01L 31/0304* | (2006.01) | |
| *H01L 31/0368* | (2006.01) | |
| *H01L 31/075* | (2012.01) | |
| *H01L 31/105* | (2006.01) | |
| *H02S 50/10* | (2014.01) | |
| *H01L 33/02* | (2010.01) | |

(52) U.S. Cl.
CPC ............ *H01S 5/34333* (2013.01); *B82Y 20/00* (2013.01); *H01L 31/03046* (2013.01); *H01L 31/0368* (2013.01); *H01L 31/075* (2013.01); *H01L 31/105* (2013.01); *H01L 33/18* (2013.01); *H01L 33/32* (2013.01); *H02S 50/10* (2014.12); *H01L 33/025* (2013.01); *H01S 2301/17* (2013.01); *Y02E 10/544* (2013.01); *Y02E 10/548* (2013.01); *Y02P 70/521* (2015.11)

(58) Field of Classification Search
CPC .................................................. H01S 5/32341
See application file for complete search history.

(56) References Cited

U.S. PATENT DOCUMENTS

2010/0051939 A1* 3/2010 Shinagawa ......... H01S 5/32341
257/43

FOREIGN PATENT DOCUMENTS

| JP | 2006-005044 A | 1/2006 |
|---|---|---|
| JP | 2006-013547 A | 1/2006 |

* cited by examiner

*Primary Examiner* — Michael Shingleton
(74) *Attorney, Agent, or Firm* — Flynn, Thiel, Boutell & Tanis, P.C.

(57) ABSTRACT

A photoelectric conversion device which inhibits characteristic degradation caused by crystal defects, and an inspection method for crystal defects in photoelectric conversion devices. The photoelectric conversion device is provided with an active layer, and a deactivator contained in the active layer.

9 Claims, 8 Drawing Sheets

PHOTOELECTRIC CONVERSION DEVICE AND CHARACTERISTIC INSPECTION METHOD FOR SAME

TECHNICAL FIELD

The present invention relates to a photoelectric conversion device and a test method of its property, and in particular, it relates to a photoelectric conversion device that can inhibit property deterioration due to a crystal fault and a detection method of a crystal fault that is inherent in the photoelectric conversion device.

BACKGROUND ART

As a photoelectric conversion element by a semiconductor, light-emitting elements such as a light-emitting diode and a semiconductor laser as well as light-receiving elements such as a solar cell have been known.

The matter required for practical use and high performance of a light-emitting element is a high-power optical output and an increased longevity of an element. On the other hand, in a case of a receiving element, improvement of conversion efficiency is required. However, it is well known that a crystal fault (dislocation) that is inherent in a semiconductor crystal constituting a photoelectric conversion element inhibits the above high performance and deteriorates operation property.

With reference to FIG. 8, the condition that a crystal fault in a semiconductor crystal deteriorates operation property of a photoelectric conversion element will be explained.

FIG. 8 is a block diagram showing the configuration of a photoelectric conversion element 100 as one example. The photoelectric conversion element 100 includes an n-type semiconductor layer 101, an active layer (photoelectric conversion unit) 102 formed on the n-type semiconductor layer 101 and a p-type semiconductor layer 103 formed on the active layer 103. These are formed as a basic structure of a photoelectric conversion device by a well known semiconductor manufacture technique etc.

Here, a basic operation of the photoelectric conversion element 100 will be briefly explained with an example of a light-emitting element.

When a current is injected in the photoelectric conversion element 100, an electron is injected from the n-type semiconductor layer 101 and a hole is injected from the p-type semiconductor layer 103. The injected electron and hole are converted to a light by a luminescence recombination process in the active layer 102 and output a light to the outside.

However, the photoelectric conversion element may include a crystal fault (threading dislocation) 201 as shown in FIG. 8 due to configuration imperfection of a semiconductor crystal. FIG. 8 schematically shows a crystal fault which is inherent in a semiconductor crystal constituting the photoelectric conversion element 100 and there exist a threading dislocation 201 and a nonluminescence center 202. For example, the threading dislocation 201 that generates at an interface between a growth substrate and a growth layer and propagates from below to the photoelectric conversion element 100 behaves as the nonluminescence center 202 that inhibits photoelectric conversion in the active layer 102.

In particular, in a nitride semiconductor, the threading dislocation is commonly included with a high density of $1\times10^8 cm^{-2}$ to $1\times10^{10} cm^{-2}$, which becomes a major obstacle of high performance of a light-emitting element.

As a technology to reduce influence of this crystal fault, for example, Patent Literatures 1 and 2 below can be listed.

CITATION LIST

Patent Literature

Patent Literature1: Japanese Unexamined Patent Application Publication No. 2006-13547A
Patent Literature2: Japanese Unexamined Patent Application Publication No. 2006-5044A Technical Problem The crystal fault reduction technology disclosed in Patent Literatures 1 and 2 belongs to crystal growth technology called as selective growth or lateral growth for those skilled in the art. In this lateral growth process, accompanied with a normal crystal growth, a surface treatment process such as mask formation is required. This causes increase of the number of steps, a problem occurs in terms of yield or manufacture cost.

The present invention is made considering these circumstances, and an object of the present invention is to provide a photoelectric conversion device that inhibits the property deterioration due to a crystal fault without increasing the number of manufacture steps and a detection method of a crystal fault which is inherent in the photoelectric conversion device.

Solution to Problem

An electric conversion device according to a first aspect of the present invention includes a photoelectric conversion unit and a dislocation deactivation unit included in the photoelectric conversion unit.

In the photoelectric conversion device according to the first aspect of the present invention, the dislocation deactivation unit may be formed to have a crystal fault.

In the photoelectric conversion device according to the first aspect of the present invention, the dislocation deactivation unit may be formed to have a photoelectric conversion function.

In the photoelectric conversion device according to the first aspect of the present invention, the photoelectric conversion device includes a first conductive unit formed above the dislocation deactivation unit, and a second conductive unit formed below the dislocation deactivation unit, wherein the first conductive unit includes a first bandgap energy, the second conductive unit includes a second bandgap energy, and the dislocation deactivation unit includes a third bandgap energy, and wherein the third bandgap energy is smaller than any of the first bandgap energy and the second bandgap energy.

Moreover, a photoelectric conversion device according to the second aspect of the present invention includes a first $In_xGa_yAl_{1-x-y}N$ layer having a first conduction type, an $In_xGa_yAl_{1-x-y}N$ photoelectric conversion unit formed on the first $In_xGa_yAl_{1-x-y}N$ layer, and a second $In_xGa_yAl_{1-x-y}N$ layer formed on the $In_xGa_yAl_{1-x-y}N$ photoelectric conversion unit and having a second conduction type, wherein ranges of x and y are defined as $0 \le x \le 1$, $0 \le y \le 1$, and the $In_xGa_yAl_{1-x-y}N$ photoelectric conversion unit includes an InN dislocation deactivation unit.

In the photoelectric conversion device according to the second aspect of the present invention, the InN dislocation deactivation unit may be formed to have a layer thickness equal to or less than a bimolecular layer thickness.

In the photoelectric conversion device according to the second aspect of the present invention, the InN dislocation deactivation unit may be formed to have a crystal fault.

In a crystal fault detection method of a photoelectric conversion device according to the third aspect of the present invention, the photoelectric conversion device includes a first $In_xGa_yAl_{1-x-y}N$ layer having a first conduction type, an $In_xGa_yAl_{1-x-y}N$ photoelectric conversion unit formed on the first $In_xGa_yAl_{1-x-y}N$ layer, and a second $In_xGa_yAl_{1-x-y}N$ layer formed on the $In_xGa_yAl_{1-x-y}N$ photoelectric conversion unit and having a second conduction type, wherein ranges of x and y are defined as $0 \leq x, \leq 1$, $0 \leq y \leq 1$, the $In_xGa_yAl_{1-x-y}N$ photoelectric conversion unit includes an InN dislocation detection unit, the InN dislocation detection unit is formed to have a crystal fault is detected based on light-emitting property of the InN dislocation detection unit.

In the crystal fault detection method of a photoelectric conversion device according to the third aspect of the present invention, the InN dislocation detection unit has a layer thickness equal to or less than a bimolecular layer thickness.

In the crystal fault detection method of a photoelectric conversion device according to the third aspect of the present invention, a crystal fault is detected based on cathodoluminescence from the InN dislocation detection unit.

As explained above, according to the present invention, property deterioration due to a crystal fault can be inhibited without increasing the number of manufacture steps even when a crystal fault is inherent in the photoelectric conversion device. Moreover, detection of a crystal fault is made easy, which facilitates a product test of the photoelectric conversion device.

DESCRIPTION OF EMBODIMENTS

Hereafter, the embodiments of the present invention will be described below referring to the accompanying drawings.

However, the descriptions don't limit the range of the present invention and they indicate only an example for explanation.

First Embodiment

Figure 1:
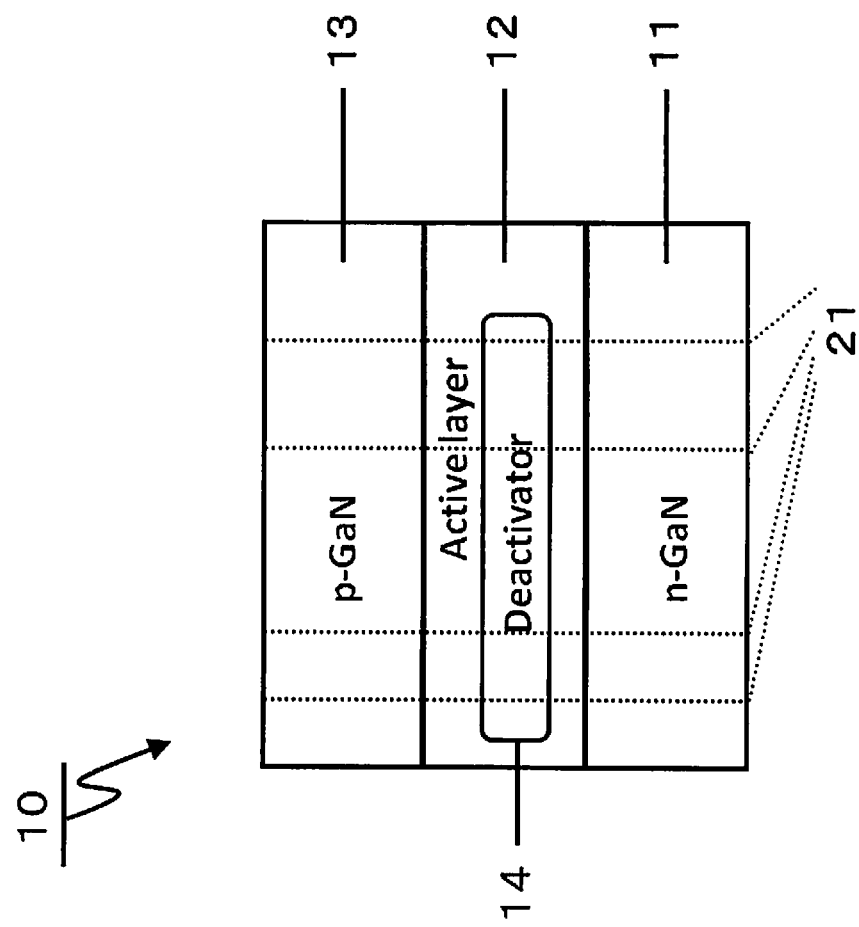
FIG. 1 is a block diagram of a configuration example of a photoelectric conversion device according to an embodiment of the present invention.

FIG. 1 is a block diagram showing a configuration example of a photoelectric conversion device 10 according to the first embodiment of the claimed invention of the present application. In FIG. 1, the photoelectric conversion device 10 includes an n-type gallium nitride (hereinafter, it is referred to as "n-GaN".) layer 11, a photoelectric conversion unit (Active layer) 12 formed on the n-GaN layer 11, a p-type gallium nitride (hereinafter, it is referred to as "p-GaN".) layer 13 formed on the photoelectric conversion unit 12 and a dislocation deactivation unit 14 included in the photoelectric conversion unit 12, and is formed by well known semiconductor manufacture technology etc. Additionally, since there is little appropriate growth substrate in a nitride-based semiconductor, when the photoelectric conversion element 10 is constituted, crystal faults 21 such as threading dislocation emitted from an interface between the N—GaN layer 11 and a substrate (figure is omitted) are included with high density of approximately $1 \times 10^8 cm^{-2}$ to $1 \times 10^{10} cm^{-2}$.

The n-GaN layer 11 is used to transport an electron, and the p-GaN layer 13 is used to transport a hole. Accordingly, resistivity and layer thickness of the n-GaN layer 11 and the p-GaN layer 13 are respectively appropriately adjusted in the viewpoint of carrier transport and a collection rate.

When the photoelectric conversion unit 12 is a light-emitting element, an injected electron-hole is converted to a light by a recombination process, and when it is a light receiving element, an absorbed light is converted to an electron-hole. As long as this function is included, the photoelectric conversion unit 12 is not limited, but it preferably includes gallium nitride (GaN), indium gallium nitride (InGaN) or indium nitride (InN) for example, and has a forbidden band width (bandgap energy) which is smaller than either of the n-GaN layer 11 or the p-GaN layer 13.

Here, the dislocation deactivation unit 14 will be explained. Here, an explanation will be made with an example that the dislocation deactivation unit 14 is an InN ultrathin film and the photoelectric conversion unit 12 is GaN.

When InN is subjected to epitaxy growth on GaN, in a case of growth of a surface c for example, as there is the degree of lattice mismatch of approximately 11% between InN and GaN, a crystal fault of high density could be newly introduced during crystal growth. This crystal fault significantly deteriorates conversion efficiency in a photoelectric conversion element. However, the inventors have found that, if InN has a bimolecular layer (2ML) or less, elastic deformation is maintained without introducing any crystal fault and coherent growth is possible to GaN as an underlayer.

Moreover, in this ultrathin InN film with a bimolecular layer thickness or less, crystal growth with highly excellent structural perfection can be performed due to immiscibility with GaN. As a result, a formation process with self order and self stop can be performed, and a precipitous InN/GaN interface is formed in the atomic layer order.

When the ultrathin InN film is inserted in the photoelectric conversion unit 12, a quantum well structure in which the ultrathin InN film is a well layer and GaN is a barrier layer is formed. That is, the ultrathin InN film quantum well layer may function as a part of the photoelectric conversion unit 12.

Figure 2:
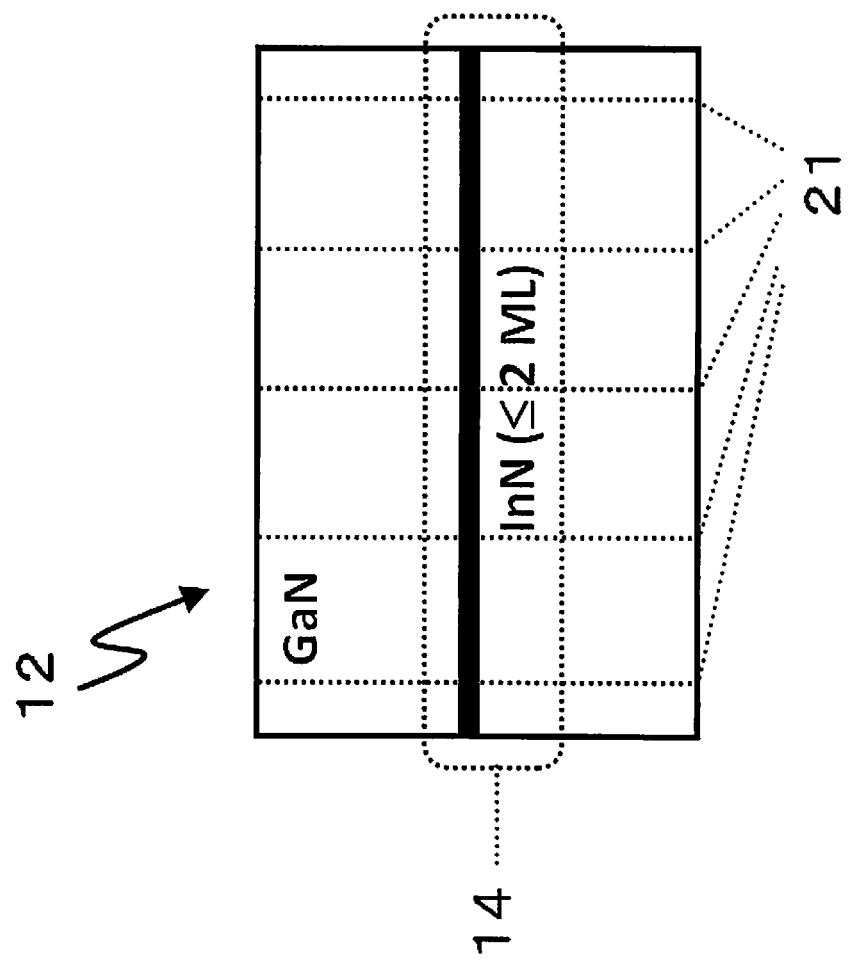
FIG. 2 is a block diagram showing the configuration of a photoelectric conversion unit according to an embodiment of the present invention.

As shown in FIG. 2, when the crystal fault 21 penetrates through the ultrathin InN film in the photoelectric conversion unit 12, in a normal concept, it is believed that this becomes nonluminescence center and reduces conversion efficiency (quantum efficiency) in the photoelectric conversion unit 12. However, contrary to the common knowledge, the inventors have found that this penetration point does not become the nonluminescence center even if the ultrathin InN film is penetrated by the crystal fault 21. That is, the inventors have found that the ultrathin InN film not only constitutes a part of the photoelectric conversion unit 12 by itself but also constitutes the dislocation deactivation unit 14 that eliminates nonluminescence due to a crystal fault.

Operation and effects of the dislocation deactivation unit 14 which depart from the conventional common knowledge will be explained with property which is particular to the ultrathin InN film.

Figure 3:
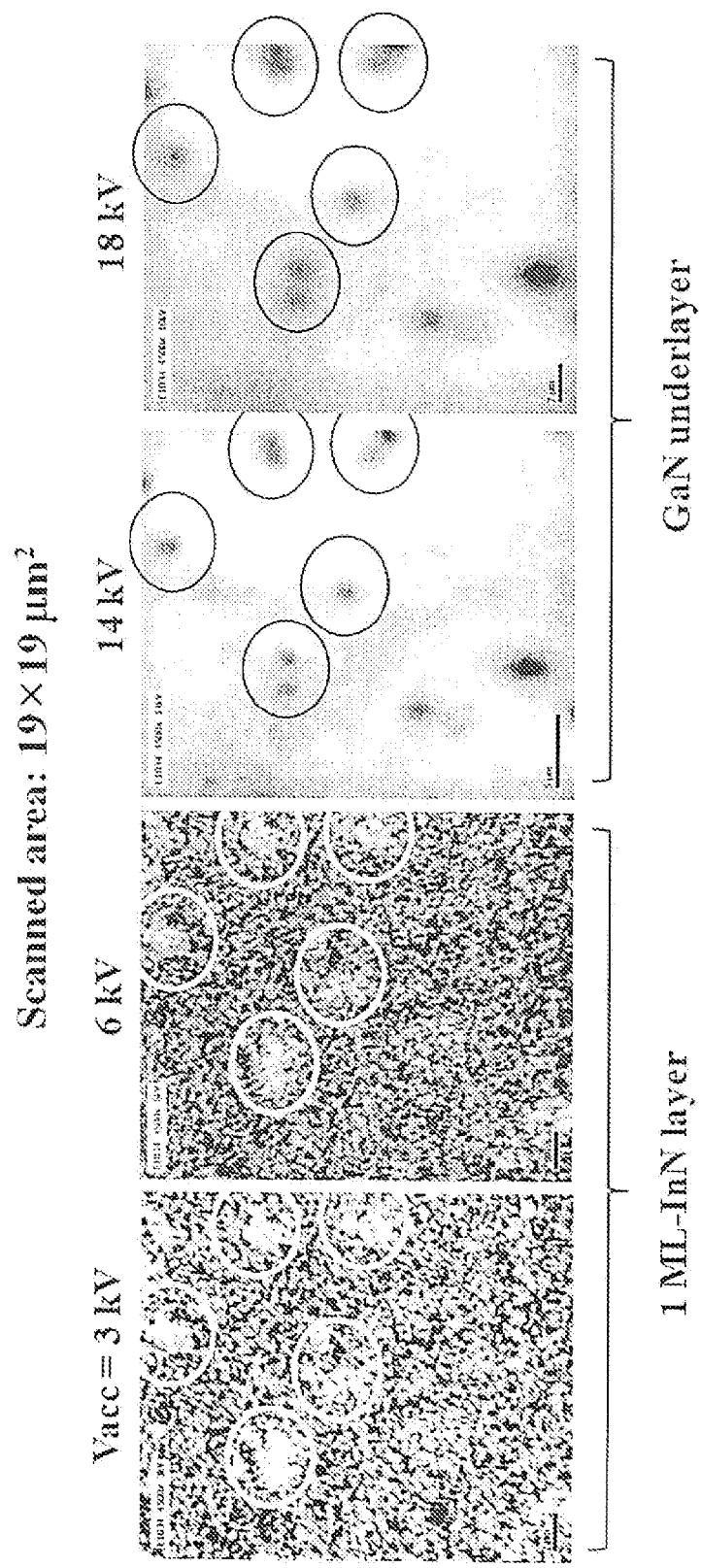
FIG. 3 is experimental data by cathodoluminescence measurement showing operation and effects of a dislocation deactivation unit of the present invention.

FIG. 3 shows a result of cathodoluminescence (CL) observation (CL image) of a sample which is grown on a GaN underlayer of a quantum well structure constituted by an ultrathin InN film well layer whose thickness is limited to a monomolecular layer thickness (1ML-InN) and a GaN layer. The CL observation refers to irradiating an accelerated electron beam from a sample surface to execute spectrofluorometric measurement from a sample. By controlling accelerating voltage of the accelerated electron beam Vacc, the insertion depth of an electron beam is controlled to obtain luminescence distribution information of a desired layer structural region (depth position).

FIG. 3 shows respective CL image when an observation region is 19 19 m$^2$ and accelerating voltage Vacc is varied in the same field of view. The accelerating voltage Vacc of 3 kV, 6 kV, 14 kV and 18 kV respectively correspond to the electron beam insertion length of 48 nm, 160 nm, 710 nm and 1100 nm. That is, when the accelerating voltage Vacc is 3 kV and 6 kV, mainly luminescence distribution from 1ML-InN quantum well is observed, and when the accelerating voltage Vacc is 14 kV and 18 kV, mainly luminescence distribution from GaN underlayer is observed.

In the CL images, white contrast corresponds to a luminescence region, and black contrast corresponds to a nonluminescence region (nonluminescence center), that is, the crystal fault 21 exists.

First, the CL images with the accelerating voltage Vacc is 14 kV and 18 kV are focused. Several scotomas are observed, and these are considered as crystal faults included in the GaN underlayer. Circular frames as a mark are applied to these scotomas.

On the other hand, in FIG. 3, focusing on the CL images with the accelerating voltage Vacc of 3 kV and 6 kV, it is found that regions of the circular frames as a mark applied to the crystal faults illuminate relatively brighter than its circumference. Conventionally, it has been considered that, in a region in which the crystal fault 21 is included in the GaN underlayer, luminescence efficiency of a quantum well grown on the region is deteriorated due to influence of the crystal fault 21. However, contrary to this common knowledge, it is firstly shown that luminescence efficiency of the ultrathin InN film is not deteriorated irrespective of the existence of the crystal fault 21. This surprisingly experimental fact clearly shows that the ultrathin InN film not only constitutes a part of the photoelectric conversion unit 12 by itself but also constitutes the dislocation deactivation unit 14 that eliminates nonluminescence due to a crystal fault.

Moreover, when the experimental results shown in FIG. 3 are interpreted from another point of view, it can be thought that the ultrathin InN film is formed in an island shape whose surface coverage is 1 or less.

Hereinafter, forming of this island ultrathin InN film and its operation and effects will be explained.

Figure 4:
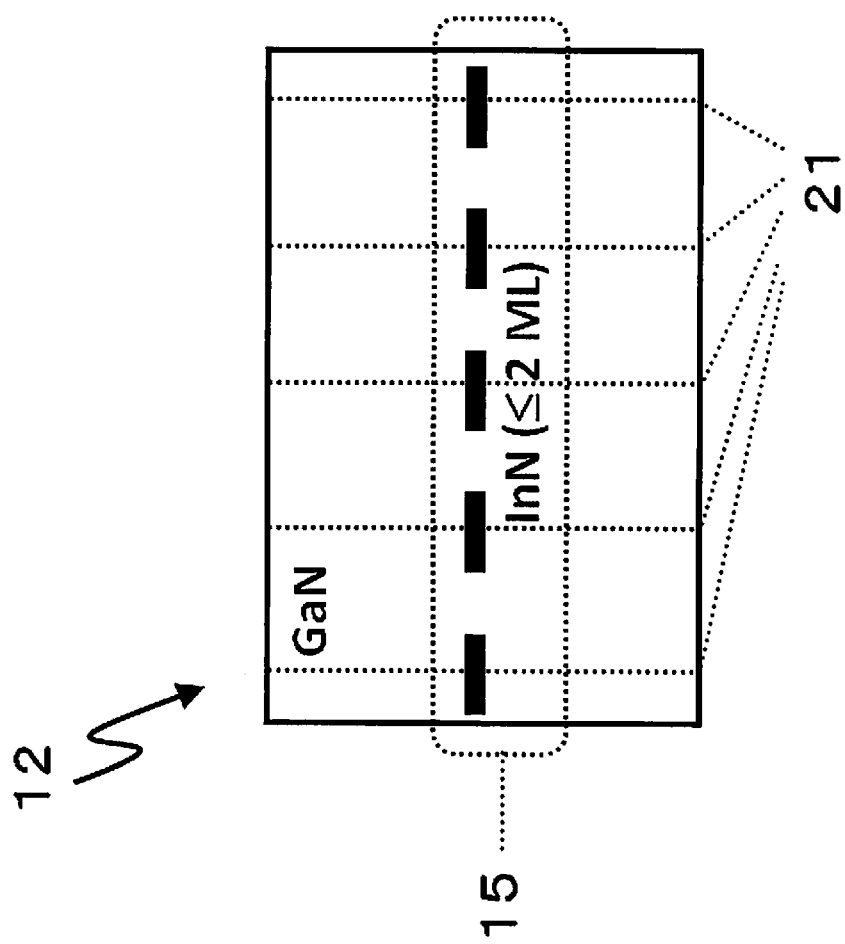
FIG. 4 is a block diagram showing the configuration of the photoelectric conversion unit according to an embodiment of the present invention.

In FIG. 3, in the CL images with the accelerating voltage Vacc of 3 kV ad 6 kV, that is, luminescence distribution images of a 1ML-InN quantum well region, the matter that the region shown by the circular frames as a mark is relatively brighter than the circumference can also be understood as improvement of luminescence strength because a quantum well structure is formed only in this region. That is, it can be thought that the ultrathin InN film is selectively grown to include the crystal fault 21 and an island structure as shown in FIG. 4 is formed.

That is, the dislocation deactivation unit 14 is not necessarily a sequential film whose surface coverage is 1, and it can eliminate nonluminescence due to the crystal fault 21 if it is an island including the crystal fault 21, that is, in a configuration with surface coverage is 1 or less.

As stated above, according to the first embodiment, property deterioration due to the crystal fault 21 can be inhibited even when the crystal fault 21 is inherent in the photoelectric conversion unit 12 of the photoelectric conversion device 10.

APPLIED EXAMPLE 1

As the first application of a photoelectric conversion element by nitride semiconductor, a light-emitting diode (LED) in an ultraviolet wavelength region has received attention. In particular, in a short wavelength region less than 365 nm which is a band edge wavelength of GaN, accompanied with a shorter wavelength of luminescence wavelength, luminescence efficiency is rapidly deteriorated. Here, efficiency improvement of an ultraviolet LED due to a nonluminescence center inhibition effect of the ultrathin InN film will be explained.

Figure 5:
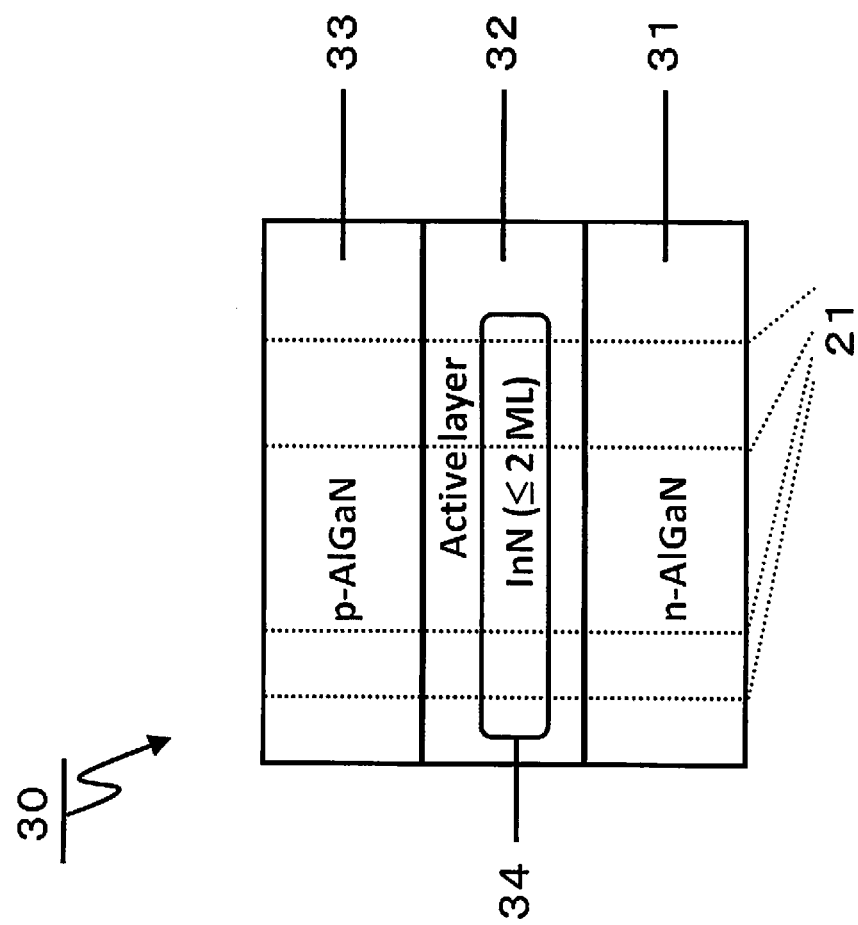
FIG. 5 is a block diagram showing a configuration example of the photoelectric conversion device according to an embodiment of the present invention.

FIG. 5 is a block diagram showing a configuration example of a photoelectric conversion device 30 which is Applied Example 1 related to the first embodiment of the claimed invention of the present application. In FIG. 5, the photoelectric conversion device 30 includes an n-type aluminum gallium nitride (hereinafter, it is referred to as "n-AlGaN") layer 31, a photoelectric conversion unit (Active layer) 32 formed on the n-AlGaN layer 31, a p-type aluminum gallium nitride (hereinafter, it is referred to as "p-AlGaN") layer 33 formed on the photoelectric conversion unit 32 and the photoelectric conversion unit 32 including a dislocation deactivation unit 34, and is formed by well known semiconductor manufacture technology.

The photoelectric conversion unit 32 is preferably constituted by gallium nitride (GaN), aluminum gallium nitride (AlGaN) or aluminum indium gallium nitride (AlInGaN) for example, and has a forbidden band width (bandgap energy) which is smaller than any of the n-AlGaN layer 31 and the p-AlGaN layer 33. The dislocation deactivation unit 34 is constituted by ultrathin InN film.

The n-AlGaN layer 31 is used to transport an electron. The p-AlGaN layer 33 is used to transport a hole. Accordingly, resistivity and layer thickness of the n-AlGaN layer 31 and the p-AlGaN layer 33 are respectively appropriately adjusted to perform efficient carrier transport. The photoelectric conversion unit 32 converts injected electron-hole into ultraviolet light by a recombination process.

Next, inhibition of nonluminescence center and efficiency improvement of ultraviolet LED by the dislocation deactivation unit 34 will be explained. Here, a case where the photoelectric conversion unit 32 is AlGaN will be explained.

By increasing Al composition of AlGaN constituting the n-AlGaN layer 31, the p-AlGaN layer 33 and the photoelectric conversion unit 32, the luminescence wavelength of an ultraviolet LED becomes shorter. However, generally, when the Al composition of AlGaN is increased, difficulty of crystal growth is more significant, and density of the crystal fault 21 included in the photoelectric conversion device 30 increases. Consequently, luminescence efficiency is deteriorated.

However, when ultrathin InN film is inserted in the photoelectric conversion unit 32, as shown in FIG. 3, nonluminescence due to the crystal fault 21 is reduced. That is, in the photoelectric conversion device 30 which is an ultraviolet LED, deterioration of luminescence efficiency accompanied by decrease of the luminescence wavelength can be inhibited by configuring the dislocation deactivation unit 34 by ultrathin InN film.

As described above, according to the applied example 1, the property deterioration due to a crystal fault 21 can be inhibited even when a crystal fault 21 is inherent in the photoelectric conversion unit 32 of the photoelectric conversion device 30.

APPLIED EXAMPLE 2

As the second application of the photoelectric conversion element by nitride semiconductor, a green laser and red-infrared wavelength region light-emitting diode (LED) has received attention. In particular, in a long wavelength region more than 500 nm, accompanied with a longer wavelength of a luminescence wavelength, luminescence efficiency is sharply deteriorated. Here, efficiency improvement of a green laser and red-infrared wavelength region LED due to a nonluminescence center inhibition effect of the ultrathin InN film will be explained.

Figure 6:
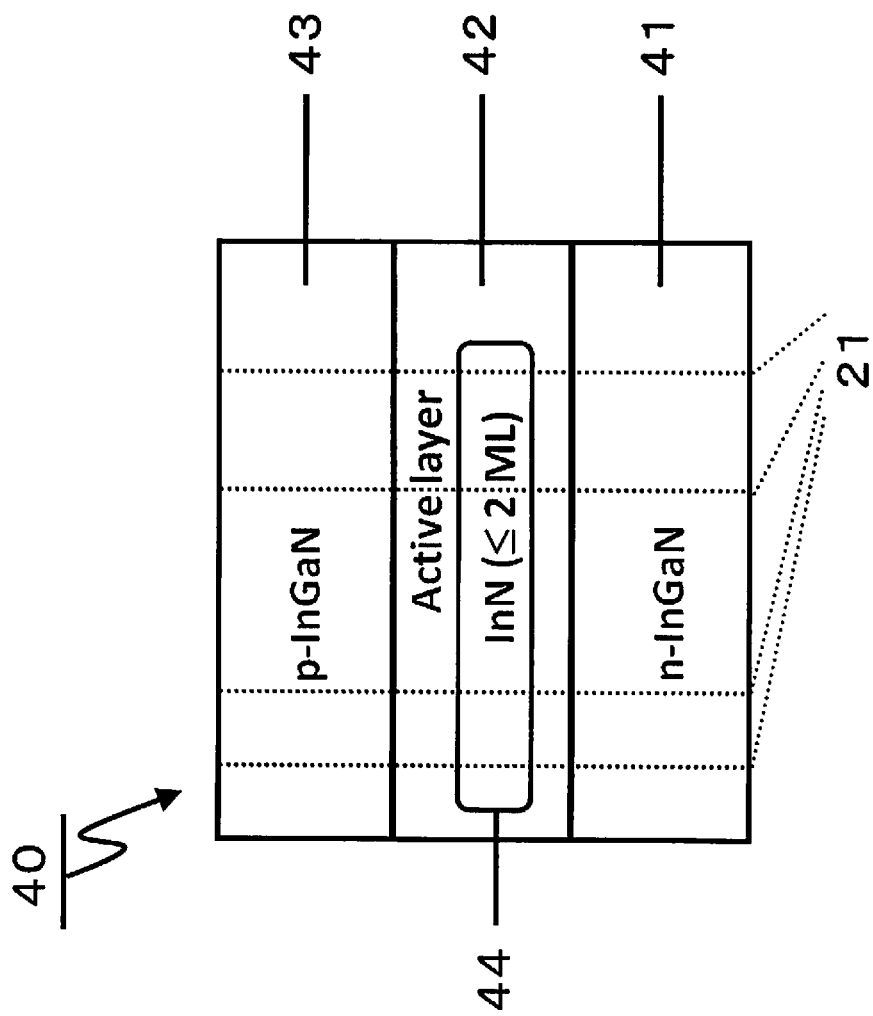
FIG. 6 is a block diagram showing a configuration example of the photoelectric conversion device according to an embodiment of the present invention.

FIG. 6 is a block diagram showing a configuration example of a photoelectric conversion device 40 which is Applied Example 2 related to the first embodiment of the claimed invention of the present application. In FIG. 6, the photoelectric conversion device 40 includes an n-type indium gallium nitride (hereinafter, it is referred to as "n-InGaN") layer 41, a photoelectric conversion unit (Active layer) 42 formed on the n-InGaN layer 41, a p-type indium gallium nitride (hereinafter, it is referred to as "p-InGaN") layer 43 formed on the photoelectric conversion unit 42 and a dislocation deactivation unit 44 included in the photoelectric conversion unit 42, and is formed by well known semiconductor manufacture technology.

The photoelectric conversion unit 42 is preferably constituted by indium nitride (InN), indium gallium nitride (InGaN) or aluminum indium gallium nitride (AlInGaN) for example, and has a forbidden band width (bandgap energy) which is smaller than any of the n-InGaN layer 41 and the p-InGaN layer 43. The dislocation deactivation unit 44 is constituted by ultrathin InN film.

The n-InGaN layer 41 is used to transport an electron. The p-InGaN layer 43 is used to transport a hole. Accordingly, resistivity and layer thickness of the n-InGaN layer 41 and the p-InGaN layer 43 are respectively appropriately adjusted to perform efficient carrier transport. The photoelectric conversion unit 42 converts injected electron-hole into a light by a recombination process.

Next, inhibition of nonluminescence center and efficiency improvement of the green laser and red-infrared wavelength region LED by the dislocation deactivation unit 44 will be explained. Here, a case where the photoelectric conversion unit 42 is InGaN will be explained.

By increasing In composition of InGaN constituting the n-INGaN layer 41, the p-InGaN layer 43 and the photoelectric conversion unit 42, the luminescence wavelength of the green laser and red-infrared wavelength region LED becomes longer. However, generally, when In composition of InGaN is increased, difficulty of crystal growth is more significant, and density of the crystal fault 21 included in the photoelectric conversion device 40 increases. Consequently, the luminescence efficiency is deteriorated.

However, when ultrathin InN film is inserted in the photoelectric conversion unit 42, as shown in FIG. 3, the nonluminescence due to the crystal fault 21 is reduced. That is, in the photoelectric conversion device 40 which is a green laser and red-infrared wavelength region LED, deterioration of luminescence efficiency accompanied by increase of the luminescence wavelength can be inhibited by configuring the dislocation deactivation unit 44 by ultrathin InN film.

As described above, according to the applied example 2 the property deterioration due to a crystal fault 21 can be inhibited even when a crystal fault 21 is inherent in the photoelectric conversion unit 42 of the photoelectric conversion device 40.

APPLIED EXAMPLE 3

As the third application of the photoelectric conversion element by nitride semiconductor, a solar cell corresponding to a wide solar light spectrum is has received attention. In particular, since the nitride semiconductor includes a high density crystal fault, junction property of a solar cell is inferior. Here, efficiency improvement of a nitride solar cell due to a dislocation deactivation effect of the ultrathin InN film will be explained.

Figure 7:
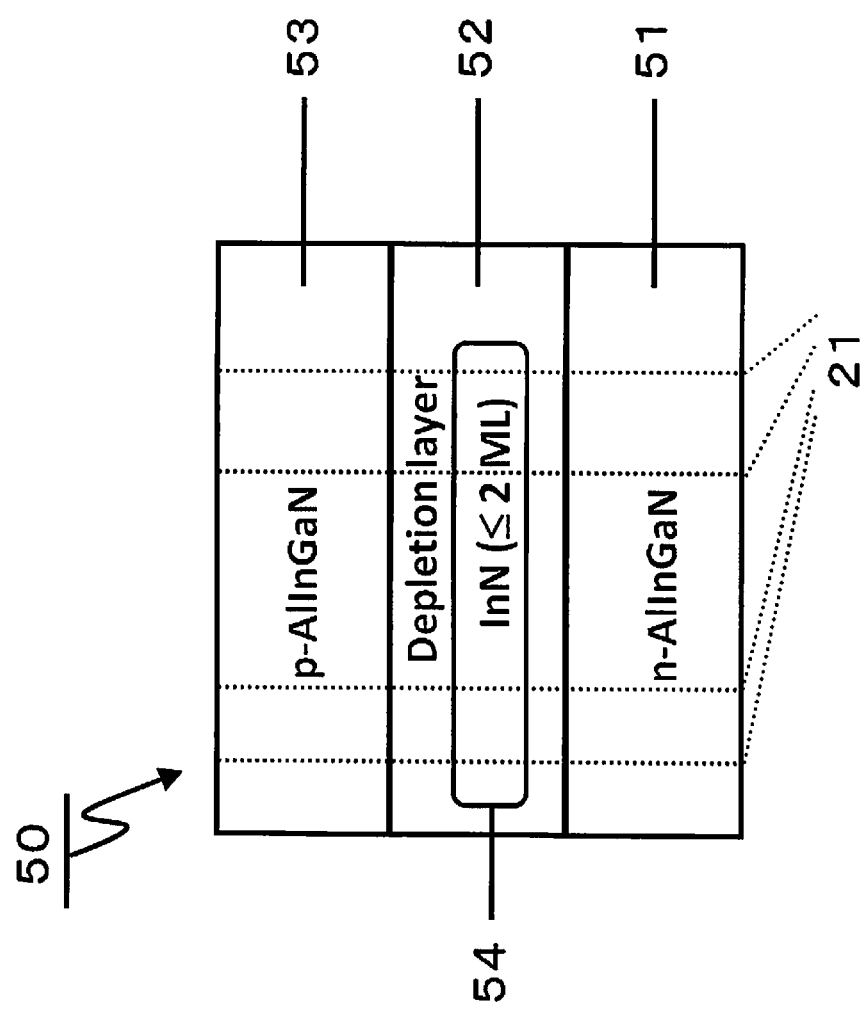
FIG. 7 is a block diagram showing a configuration example of the photoelectric conversion device according to an embodiment of the present invention.
Figure 8:
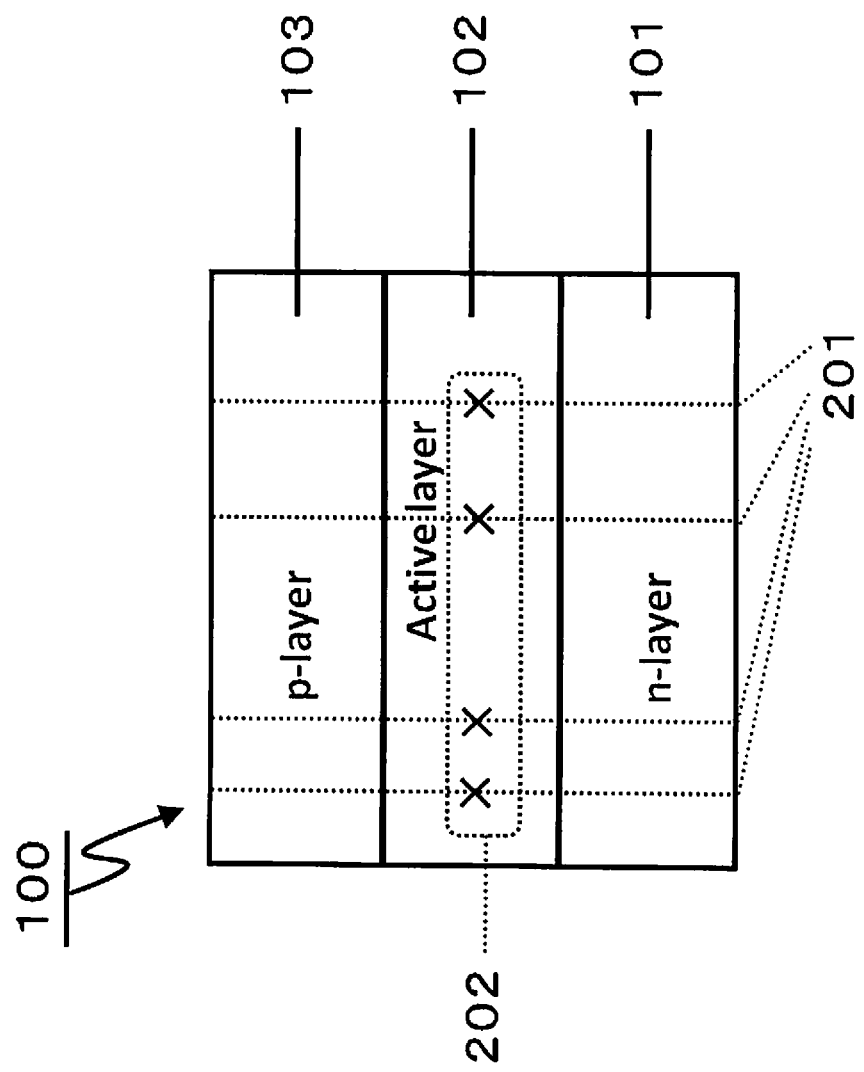
FIG. 8 is a block diagram showing a configuration example of a photoelectric conversion device of the prior art.

FIG. 7 is a block diagram showing a configuration example of a photoelectric conversion device 50 which is Applied Example 3 related to the first embodiment of the claimed invention of the present application. In FIG. 7, the photoelectric conversion device 50 includes an n-type aluminum indium gallium nitride (hereinafter, it is referred to as "n-AlInGaN") layer 51, a photoelectric conversion unit (Depletion layer) 52 formed on the n-AlInGaN layer 51, a p-type aluminum indium gallium nitride (hereinafter, it is referred to as "p-AlInGaN") layer 53 formed on the photoelectric conversion unit 52 and a dislocation deactivation unit 54 included in the photoelectric conversion unit 52, and is formed by well known semiconductor manufacture technology etc.

The photoelectric conversion unit 52 is preferably constituted by gallium nitride (GaN), indium gallium nitride (InGaN), aluminum indium nitride (AlInN) or aluminum indium gallium nitride (AlInGaN) for example, and has a forbidden band width (bandgap energy) which is smaller than any of the n-AlInGaN layer 51 and the p-AlInGaN layer 53. The dislocation deactivation unit 54 is constituted by the ultrathin InN film.

The n-AlInGaN layer 51 is used to transport an electron. The p-AlInGaN layer 53 is used to transport a hole. Accordingly, resistivity and layer thickness of the n-AlInGaN layer 51 and the p-AlInGaN layer 53 are respectively appropriately adjusted in the viewpoint of carrier transport and a collection rate. The photoelectric conversion unit 52 converts an absorbed light into electron-hole.

Next, improvement of junction property of the solar cell and efficiency improvement of the nitride solar cell by the dislocation deactivation unit 54 will be explained. Here, a case where the photoelectric conversion unit 52 is InGaN will be explained.

By increasing In composition of InGaN constituting the n-AlInGaN layer 51, the p-AlInGaN layer 53 and the photoelectric conversion unit 52, a solar cell that covers substantially the entire region of solar spectrum is configured. However, generally, when the In composition of the AlInGaN and InGaN is increased, the difficulty of crystal growth is more significant, and density of the crystal fault 21 included in the photoelectric conversion device 50 increases. Consequently, the junction property of a solar cell is deteriorated and conversion efficiency of a solar cell is deteriorated.

However, when ultrathin InN film is inserted in the photoelectric conversion unit 52, as shown in FIG. 3, a dislocation deactivation effect due to the crystal fault 21 is generated. That is, in the photoelectric conversion device 50 which is a solar cell, a decrease of conversion efficiency accompanied by deterioration of conjunction property of a solar cell can be inhibited by configuring the dislocation deactivation unit 54 by ultrathin InN film.

As described above, according to the applied example 3, property deterioration due to a crystal fault 21 can be inhibited even when a crystal fault 21 is inherent in the photoelectric conversion unit 52 of the photoelectric conversion device 50.

Second Embodiment

In the first embodiment, operation and effects of the dislocation deactivation unit by ultrathin InN film have been stated. Incidentally, when an experimental result shown in FIG. 3 is interpreted from another viewpoint, it is found that ultrathin InN film can be used as a dislocation detection unit 15. Hereinafter, operation and effects of the dislocation detection unit 15 by ultrathin InN film will be explained.

A growth mechanism of ultrathin InN film is a self-order and self-stop process in which any excessive InN than the designed film thickness is provided to be evaporated and removed on a growth surface. However, it can be thought that InN is fixed by a pin in a region in which a crystal fault exists, and thus an evaporation and removal rate is inhibited to regions that include no crystal fault.

Accordingly, as shown in FIG. 4, it is interpreted that ultrathin InN film grows as a fractional layer InN only in a region in which a crystal fault exists. The fractional layer InN means that a surface coverage is 1 or less. For example, 0.5 molecular layer corresponds to an island structure with a monomolecular layer thickness and surface coverage of 50%, that is, a quantum disk structure.

Generally, to detect crystal dislocation, observation by a transmission electron microscope or pit detection by an etching process (etch pit) are known. Any of these methods belong to destruction inspection of a sample, and their processes are complicated.

However, cathodoluminescence (CL) observation basically belongs to nondestructive inspection, and no previous process to a sample is needed. Consequently, detection of a crystal fault becomes easy, which makes a product test of the photoelectric conversion device simple.

Moreover, in the conventional CL observation, a crystal fault has been evaluated as a scotoma in a CL image. This is not problematic since a high contrast ratio to a scotoma can be obtained in a sample with high luminescence efficiency. However, in a sample with low luminescence efficiency, that is, in a case where dislocation detection is highly needed, a scotoma exists in a relatively dark field of vision, so that a light-dark contrast of the CL image cannot be fully obtained.

However, in this embodiment, by inserting ultrathin InN film in the photoelectric conversion unit 12 of the photoelectric conversion device 10, the ultrathin InN film is formed to have the crystal fault 21 and shows luminescence property. Consequently, the ultrathin InN film may be used as the dislocation detection unit 15.

As stated above, according to the second embodiment, by observing the dislocation detection unit 15 in a case where a crystal fault 21 is inherent in the photoelectric conversion unit 12 of the photoelectric conversion device 10, the crystal fault 21 can be easily detected. This makes a product test of the photoelectric conversion device 10 simple.

Additionally, in each embodiment described above, an example in which the ultrathin InN film is constituted by 1 layer has been explained. However, the invention is not limited to this, for example, a configuration in which a number of ultrathin films InN are inserted is also acceptable.

Furthermore, the present invention shall not be limited by the above-described embodiments, and modification, substitution, and abbreviation are possible within the range which is not deviated from the intention of the present invention.

Moreover, as it is clear from the above embodiments, layers including nitride which sandwich the photoelectric conversion unit have conductivity and are expressed as a first conductive unit and a second conductive unit. In addition, focusing on materials, the first and second conductive units are respectively expressed as a $In_xGa_yAl_{1-x-y}N$ layer, and in particular, the first conductive unit is expressed as a first conduction type $In_xGa_yAl_{1-x-y}N$ layer and the second conductive unit is expressed as a second conduction type $In_xGa_yAl_{1-x-y}N$ layer. Additionally, in such a case, x and y may be the same or different, and a range of x and y may be $0 \leq x \leq 1$ and $0 \leq y \leq 1$.

Also, as it is clear from the above embodiments, the photoelectric conversion unit can be expressed as an $In_xGa_yAl_{1-x-y}N$ layer.

Moreover, as it is clear from the above embodiments, the first conductive unit, the second conductive unit and the photoelectric conversion unit respectively include bandgap energy. In addition, it is preferable that bandgap energy of a third conductive unit (the third bandgap energy) is smaller than any of bandgap energy of the first conductive unit (the first bandgap energy) and bandgap energy of the second conductive unit (the first bandgap energy).

INDUSTRIAL APPLICABILITY

The photoelectric conversion device according to the present of the invention is applicable for a light-emitting element and a light-receiving element which are available with a ultraviolet-infrared light, especially a solar cell.

EXPLANATION OF NUMERALS 10, 30, 40, 50, 100 . . . photoelectric conversion device
11 . . . n-type gallium nitride layer
13 . . . p-type gallium nitride layer
12, 32, 42, 52, 102 . . . photoelectric conversion unit
14, 34, 44, 54 . . . dislocation deactivation unit
15 . . . dislocation detection unit
31 . . . n-type aluminum gallium nitride layer
33 . . . p-type aluminum gallium nitride layer
41 . . . n-type indium gallium nitride layer
43 . . . p-type indium gallium nitride layer
51 . . . n-type aluminum indium gallium nitride layer
53 . . . p-type aluminum indium gallium nitride layer
101 . . . n-type semiconductor layer
103 . . . p-type semiconductor layer 21, 201 ... crystal fault
202 ... nonluminescence center

What is claimed is:

1. A photoelectric conversion device comprising:
a first $In_xGa_yAl_{1-x-y}N$ layer having a first conduction type and a first bandgap energy;
an $In_xGa_yAl_{1-x-y}N$ photoelectric conversion unit formed on the first $In_xGa_yAl_{1-x-y}N$ layer and having a third bandgap energy; and
a second $In_xGa_yAl_{1-x-y}N$ layer formed on the $In_xGa_yAl_{1-x-y}N$ photoelectric conversion unit and having a second conduction type and a second bandgap energy, wherein $0 \leq x \leq 1$ and $0 \leq y \leq 1$,
the $In_xGa_yAl_{1-x-y}N$ photoelectric conversion unit includes an InN dislocation deactivation unit having a film structure,
the third bandgap energy is smaller than any of the first bandgap energy and the second bandgap energy, and
the InN dislocation deactivation unit has not more than a bimolecular layer thickness and an island layer coverage.

2. A crystal fault detection method of a photoelectric conversion device comprising:
a first $In_xGa_yAl_{1-x-y}N$ layer having a first conduction type;
an $In_xGa_yAl_{1-x-y}N$ photoelectric conversion unit formed on the first $In_xGa_yAl_{1-x-y}N$ layer; and
a second $In_xGa_yAl_{1-x-y}N$ layer formed on the $In_xGa_yAl_{1-x-y}N$ photoelectric conversion unit and having a second conduction type,
wherein ranges of x and y are defined as $0 \leq x, y \leq 1$,
the $In_xGa_yAl_{1-x-y}N$ photoelectric conversion unit includes an InN dislocation detection unit,
the InN dislocation detection unit is formed to have a crystal fault, and
a crystal fault is detected based on light-emitting property of the InN dislocation detection unit.

3. The photoelectric conversion device according to claim 1, wherein the InN dislocation deactivation unit is formed to have a crystal fault.

4. The crystal fault detection method according to claim 2, wherein the InN dislocation detection unit has a layer thickness equal to or less than a bimolecular layer thickness.

5. The crystal fault detection method according to claim 2, wherein a crystal fault is detected based on cathodoluminescence from the InN dislocation detection unit.

6. The photoelectric conversion device of claim 1, wherein the InN dislocation deactivation does not block propagation or increment of a crystal defect but suppresses a degradation effect of the crystal defect on the performance of the photoelectric conversion device.

7. The photoelectric conversion device of claim 1, wherein x=0 and y>0.

8. The photoelectric conversion device of claim 1, wherein x>0 and y=0.

9. The photoelectric conversion device of claim 1, wherein x>0 and y>0.

* * * * *